(12) United States Patent
Westgate

(10) Patent No.: US 6,728,667 B1
(45) Date of Patent: Apr. 27, 2004

(54) MULTIPLE INSTANTIATION SYSTEM

(75) Inventor: Keith Westgate, Andover, MA (US)

(73) Assignee: Quickturn Design Systems, Inc., San Jose, CA (US)

( * ) Notice: Subject to any disclaimer, the term of this patent is extended or adjusted under 35 U.S.C. 154(b) by 0 days.

(21) Appl. No.: 09/176,041

(22) Filed: Oct. 20, 1998

(51) Int. Cl.$^7$ .............................................. G06F 13/00
(52) U.S. Cl. ........................... 703/14; 714/741; 714/39
(58) Field of Search .............................. 703/14, 17, 26; 714/742, 39, 33, 726, 724, 729, 730, 741; 717/130

(56) References Cited

U.S. PATENT DOCUMENTS

| | | | | |
|---|---|---|---|---|
| 5,321,701 A | * | 6/1994 | Raymond et al. | 371/27 |
| 5,604,895 A | * | 2/1997 | Raimi | 395/500 |
| 5,655,107 A | * | 8/1997 | Bull | 395/500 |
| 5,862,361 A | * | 1/1999 | Jain | 395/500 |
| 5,892,720 A | * | 4/1999 | Stave et al. | 365/201 |
| 6,052,524 A | * | 4/2000 | Pauna | 395/500.43 |
| 6,053,948 A | * | 4/2000 | Vaidyanathan et al. | 703/14 |
| 6,058,492 A | * | 5/2000 | Sample et al. | 714/33 |
| 6,237,121 B1 | * | 5/2001 | Yadavalli et al. | 714/726 |
| 6,260,182 B1 | * | 7/2001 | Mohan et al. | 716/12 |
| 6,363,519 B1 | * | 3/2002 | Levi et al. | 716/16 |

* cited by examiner

Primary Examiner—Samuel Broda
Assistant Examiner—Thai Phan
(74) Attorney, Agent, or Firm—Orrick, Herrington & Sutcliffe LLP

(57) ABSTRACT

This invention features a method of simultaneously conducting simulation testing of a plurality of simulated device designs using cycle-based software which is capable of simultaneously executing a number of simulation tests along separate test pathways for each simulated device. The method is appropriate for situations in which the simulated device designs each comprise essentially identical sequences of boolean instructions. The method contemplates designating a single bit location of a multiple-word memory device for each test of each simulated device. As the test progress, the results of each test are stored in the appropriate designated bit location for such test. This allows a total number of simultaneous tests equal to the number of bits available in the words making up the memory of the memory device.

5 Claims, No Drawings

MULTIPLE INSTANTIATION SYSTEM

FIELD OF THE INVENTION

This invention relates to a method of simultaneously conducting simulation testing of a number of simulated electronic device designs each having essentially identical sequences of instructions.

BACKGROUND OF THE INVENTION

Cycle-based simulation software is used to simulate electronic devices to decrease the cost and complexity of building large electronic systems, microprocessors, and ASICs. Such simulation software is typically much faster than event-driven simulators, and has performance levels that approach those of more expensive hardware accelerators.

One cycle-based simulation software product, SpeedSim/3 available from Quickturn Design Systems -Advanced Simulation Division of Chelmsford, Mass., is able to perform up to 32 tests simultaneously on one image of the design model on a single workstation. This technique of simultaneously running multiple diagnostics or application program streams has a theoretical improvement of 32 times performance, and a typical actual 5 to 10 times performance gain in total throughput.

In multi processor based designs, a number of identical processors communicate with a common memory. The boolean logic streams used to simulate such processors is virtually identical, while still allowing for differences, due in part to the personality pins of the processors.

With prior art cycle-based simulation software, one word of the memory device used in the simulation testing is used to store the results of a single simulation test. Thus, a four word memory device would allow up to four simultaneous tests to be run. The number of simultaneous tests, and thus by definition the speed with which testing occurs, is thus constrained by the particular memory device used.

SUMMARY OF THE INVENTION

It is therefore an object of this invention to provide a simulation testing method which reduces the effective network size, thus increasing capacity and performance.

It is a further object of this invention to provide a simulation testing method in which a number of simultaneous tests can be run, the number of such simultaneous tests equal to the total number of bits in a row of the memory device used to store test results, regardless of the number of words in the row.

This invention features methods of simultaneously conducting simulation testing of a plurality of simulated electronic device designs using cycle-based software which is capable of simultaneously executing a plurality of simulation tests along separate test pathways for each simulated device, in which the simulated device designs each comprise essentially identical sequences of instructions. The basic method includes the steps of providing a memory device which holds a matrix of memory bits, in which each row of the matrix holds a plurality of data words each made up of a plurality of bits.

A single bit location of the data words of the memory device is then designated for each test of each simulated device. The designated bit locations may be grouped into a number of groups equal to the number of simulated electronic device designs being tested. The simulation test on each simulated device design is then conducted.

During the conduct of the simulation tests, the test results for each test are stored in the designated bit location for the test, to allow testing to simultaneously occur along one or more test pathways for each simulated electronic device design, with the quantity of such simultaneous tests equal to no more than the number of bits in a row of the matrix of memory bits of the memory device.

In the preferred embodiment, the same number of simultaneous tests are conducted on each simulated device. Preferably, a number of simultaneous tests are conducted on each simulated device. That number may equal the number of bits in a data word of the memory device, in which case a single data word is used to store test results for each simulated device.

DESCRIPTION OF THE PREFERRED EMBODIMENT

This invention may be accomplished in methods of simultaneously conducting simulation testing of a plurality of simulated electronic device designs, in which the simulated device designs each comprise essentially identical sequences of boolean instructions. Cycle-based simulation software, which is capable of simultaneously executing a plurality of simulation tests along separate test pathways for each simulated device, is used in the invention. The invention also uses a memory device which holds a matrix of memory bits, in which each row of the matrix holds a plurality of data words each made up of a plurality of bits. Typically, the memory (32 or 64 bit) holds a matrix of either 4 or 8, 8 bit words.

A single bit location of those data words of the memory device is designated for each test of each simulated device. These designated bit locations may be grouped into a number of groups equal to the number of simulated electronic device designs being tested. During the conduct of the simultaneous simulation tests, the test results for each test are stored in the designated bit location for that particular test. This allows testing to simultaneously occur along one or more test pathways for each simulated electronic device design, with the quantity of such simultaneous tests equal to no more than the number of bits (typically 32 or 64) in a row of the matrix of memory bits of the memory device.

There are times in which it is desirable to perform simultaneous simulation tests of multiple instantiations of simulated device designs. An example would be in multi processor based designs, in which multiple identical processors communicate with a common memory. The boolean logic representing these processors is identical, or at least virtually identical; there may be slight differences in the logic depending on differences in the personality pins of the processors being simulated, which do not affect this invention. This invention results in faster simulation testing of such multiple processor based designs. Network switches also have a high degree of identical logic, making them good candidates for this invention as well.

The preferred method of this invention contemplates the use of a memory device which holds a matrix of memory bits. In the preferred embodiment, the invention employs a 32 bit memory array that holds four, 8 bit words per row. Obviously, other memory devices can be used. In the method of this invention, a single bit of the 32 bits available in the memory is designated for each test of each simulated device. Since the logic is boolean, a single bit is sufficient for each test; there is no interaction between the tests. This same bit in each row of the memory device is used exclusively and only for that particular test. This allows a number of simultaneous tests to be run which is equal to the number of bits available in a row of the memory device. In the preferred embodiment, then, up to 32 simultaneous tests can be run.

In one non-limiting example of the application of the method of this invention, it is desired to simulate four instances, which may be simulations of four virtually identical processors. With a 32 bit memory device, up to 32 simultaneous tests can be run. Thus, it is possible to run eight simultaneous tests on each of the four instances. It is not a limitation of this invention that the same number of simultaneous tests are accomplished on each instance. Rather, this invention allows simultaneous testing of multiple instantiations, whether there is one, or more than one, simulation test being simultaneously accomplished on each instance.

Since the instances are virtually identical, one stream of logic can be used to replicate each of the instances being tested. Below (Example I) is an example of simple logic under test, which is used to illustrate the reduction in the number of operations necessary to test the logic.

```

# logic under test
# Verilog HDL

module top;
    wire clk;
    reg a, d, g, j;
    always @ (posedge clk)
        a = b & c;
    always @ (posedge clk)
        d = e & f;
    always @ (posedge clk)
        g = h & i;
    always @ (posedge clk)
        j = k & l;
endmodule
```

Example II is an illustration of the memory layout and generated CPU instructions necessary to simulate the Verilog HDL set forth above in Example I, using the prior art methodology.

```
memory layout:
address  variables
0        a
1        b
2        c
3        d
4        e
5        f
6        g
7        h
8        i
9        j
10       k
11       l
# Generated CPU Instructions
# all load and store instructions are byte size

ldb   b, r0     # load b
ldb   c, r1     # load c
and   r1, r0    # do the AND
stb   r0, a     # store the value in a
ldb   e, r0     # load e
ldb   f, r1     # load f
and   r1, r0    # do the AND
stb   r0, d     # store the value in d
ldb   h, r0     # load h
ldb   i, r1     # load i
```

-continued

```
and   r1, r0    # do the AND
stb   r0, g     # store the value in g
ldb   k, r0     # load k
ldb   l, r1     # load l
and   r1, r0    # do the AND
stb   r0, j     # store the value in j
```

Example III illustrates the memory layout and generated CPU instructions using this invention, illustrating the reduced number of instructions.

EXAMPLE III

```
memory layout:
address  variable
0        b
1        e
2        h
3        k
4        c
5        f
6        i
7        l
8        a
9        d
10       g
11       j
# Generated CPU Instructions
# all loads and stores are word size

ldw   #0, r0    # load b,e,h,k
ldw   #4, r1    # load c,f,i,l
and   r1, r0    # do the AND
stw   r0, #8    # store a,d,g,j
```

The result of this invention is thus a dramatic time savings relative to the number of instances tested times the number of simultaneous tests conducted on each instance. As shown above, for example, in the prior art methodologies in which there are separate logic streams for each instance, in order to simulate testing of one instruction on each instance, the simulation software must perform a number of instructions equal to one times the number of instances. In the method of this invention, the operations are the same for each instance. Thus, one instruction for each instance takes only a single instruction time period. In the preferred embodiment, all the bits of a single word of the memory device are designated for each simulated device. With the memory example set forth above, this would allow up to eight simultaneous tests to be conducted on each of four instances.

In an alternative embodiment, simultaneous testing need not be accomplished. Since the invention contemplates designating one bit of the memory array for each test being accomplished, in the above example with a 32 bit memory array, up to 32 tests can be performed. Those 32 tests could be performed on 32 instances, in which case there would only be a single test running simultaneously for each instance. Thus, this invention allows testing of a number of instances times a number of simultaneous tests on each instance which must be less than or equal to the number of bits in each row of the memory array. This flexibility allows the invention to accomplish in a minimum amount of time the simultaneous testing of a number of instances of virtually identical boolean instructions, with the ability to accomplish one or more simultaneous tests on each such instance.

Other embodiments will occur to those skilled in the art and are within the following claims:

What is claimed is:

1. A method of verifying functionality of an integrated circuit design prior to manufacture by simultaneously conducting simulation testing of a plurality of simulated electronic device designs using cycle-based simulation software which is capable of simultaneously executing a plurality of simulation tests along separate test pathways for each said simulated device, in which the simulated device designs each comprise essentially identical sequences of instructions, the method comprising:

provided a memory device which holds a matrix of memory bits, in which each row of said matrix holds a plurality of data words each made up of a plurality of bits;

designating a single bit location of said data words of said memory device for each said test of each said simulated device;

grouping said designated bit locations into a number of groups equal to the number of simulated electronic device designs being tested;

conducing said simulation tests on each said simulated device design for each group at substantially the same time; and during the conduct of said simulation tests, storing test results for each said test in said designated bit location for said test, to allow testing to simultaneously occur along one or more test pathways for each said simulated electronic device design, with the quantity of such simultaneous tests equal to no more than the number of bits in a row of said matrix of memory bits of said memory device.

2. The method of claim 1 in which the same number of simultaneous tests are conducted on each said simulated device.

3. The method of claim 1 in which a plurality of simultaneous tests are conducted on each said simulated device.

4. The method of claim 3 in which the number of simultaneous tests conducted on each said simulated device equals the number of bits in a data word of said memory device, so that a single said data word is used to store test results for each said simulated device.

5. A method of verifying functionality of an integrated circuit design prior to manufacture by simultaneously conducting simulation testing of a plurality of simulated electronic device using cycle-based simulation software which is capable of simultaneously executing a plurality of simulation tests along separate test pathways for each said simulated device, in which the simulated device designs each comprise essentially identical sequences of instructions, the method comprising:

providing a memory device which holds a matrix of memory bits, in which each row of said matrix holds a plurality of data words each made up of a plurality of bits;

designating a single bit location of said data words of said memory device for each said test of each said simulated device;

grouping said designated bit locations into a number of groups equal to the number of simulated electronic device designs being tested;

simultaneously conducting the same plurality of said simulation tests on each said simulated device design; and during the conduct of said simulation tests, storing test results for each said test in said designated bit location for said test, to allow testing to simultaneously occur along one or more test pathways for each said simulated electronic device design, with the quantity of such simultaneous tests equal to no more than the number of bits in a row of said matrix of memory bits of said memory device.

* * * * *